United States Patent
Summers

(10) Patent No.: US 7,604,754 B2
(45) Date of Patent: *Oct. 20, 2009

(54) RESISTOR COMPOSITIONS FOR ELECTRONIC CIRCUITRY APPLICATIONS

(75) Inventor: John D. Summers, Chapel Hill, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 60 days.

This patent is subject to a terminal disclaimer.

(21) Appl. No.: 11/985,950

(22) Filed: Nov. 19, 2007

(65) Prior Publication Data

US 2008/0185561 A1  Aug. 7, 2008

Related U.S. Application Data

(60) Provisional application No. 60/859,732, filed on Nov. 17, 2006.

(51) Int. Cl.
*H01B 1/00* (2006.01)
*H01B 1/02* (2006.01)
*H01B 1/12* (2006.01)
*C08G 73/10* (2006.01)
*B22F 7/00* (2006.01)

(52) U.S. Cl. ............... 252/500; 252/518.1; 252/519.33; 524/600; 106/1.05

(58) Field of Classification Search ................ 252/500, 252/518.1, 519.33; 524/600; 106/1.05
See application file for complete search history.

(56) References Cited

U.S. PATENT DOCUMENTS

| 4,519,941 | A | * | 5/1985 | Anderson | 252/514 |
| 4,557,860 | A | * | 12/1985 | DiSalvo et al. | 252/512 |
| 5,206,074 | A | * | 4/1993 | Davis et al. | 428/209 |
| 5,605,763 | A | * | 2/1997 | Yusa et al. | 428/473.5 |
| 5,667,899 | A | * | 9/1997 | Yusa et al. | 428/473.5 |
| 6,214,923 | B1 | * | 4/2001 | Goto et al. | 524/514 |
| 6,631,551 | B1 | | 10/2003 | Bowles et al. | |
| 7,026,382 | B2 | * | 4/2006 | Akiba et al. | 524/268 |
| 2004/0113127 | A1 | * | 6/2004 | Min et al. | 252/500 |
| 2005/0154181 | A1 | * | 7/2005 | Dueber et al. | 528/310 |
| 2005/0230667 | A1 | * | 10/2005 | Komagata et al. | 252/500 |

FOREIGN PATENT DOCUMENTS

JP    H07-247339    *    9/1995

* cited by examiner

*Primary Examiner*—Mark Kopec
*Assistant Examiner*—Jaison P Thomas
(74) *Attorney, Agent, or Firm*—Konrad S. Kaeding

(57) ABSTRACT

Resistor compositions are disclosed, made from polymer thick film resistor formulations comprising a polyimide component, a sterically hindered hydrophobic epoxy component and a solvent component having a Hanson polar solubility parameter between 2.1 and 3.0 and having a normal boiling point between 210 and 260° C. The weight ratio of polyimide component ("A") to epoxy component ("B") is A:B, where A is between and including 1 to 15 and where B is 1.

3 Claims, No Drawings

RESISTOR COMPOSITIONS FOR ELECTRONIC CIRCUITRY APPLICATIONS

FIELD OF INVENTION

The present invention relates generally to circuit boards having resistor patterns. More specifically, the resistor compositions of the present invention are made from polymer thick film resistor formulations comprising a polyimide component, an epoxy component and a solvent component.

BACKGROUND OF THE INVENTION

U.S. Pat. No. 6,631,551 is directed to polymer thick film ("PTF") materials for application (e.g., ink printing) to an electrically conductive foil, where heat is used to bond the PTF to the foil and is also used to cure the PTF to a more rigid resistive mass.

SUMMARY OF THE INVENTION

The present invention is directed to circuit board having a PTF resistor component made from a PTF resistor paste. The PTF resistor paste comprises:
  i. a polyimide component,
  ii. a sterically hindered hydrophobic epoxy component; and
  iii. an organic solvent.

The PTF resistor paste is applied to and then cured upon an electrically conductive foil.

The present invention is also directed to methods of forming a passive electrical component upon or into a circuit board. Such methods of the present invention comprise:
  i. preparing a precursor polymer thick film ("PTF") composition comprising a polyimide component, a sterically hindered hydrophobic epoxy and an organic solvent;
  ii. applying the precursor PTF component to an electrically conductive foil;
  iii. heating the printed foil: a. to bond the precursor PTF component to the foil, b. to remove the screen printing solvent, and c. to cure the precursor PTF component to a cured PTF component;
  iv. laminating the foil (with the cured PTF component side down) to a circuit board so as to attach the cured PTF component to the circuit board; and
  v. etching the foil to form at least one of two terminations that contact the cured PTF component to yield a passive electrical component.

DETAILED DESCRIPTION OF THE PREFERRED EMBODIMENTS

An embodiment of the present invention is directed to an organic circuit board with a resistor component. The resistor component comprises a polymer binder having: i. a phenolic-containing polyimide resin; and ii. an epoxy resin capable of reacting with the phenolic groups on the polyimide to form a cross-linked polymer network. In one embodiment, the polymer binder is used to make a resistor paste.

In one embodiment of the present invention, an electrically conductive material is added to the polymer binder component (or a precursor thereto) to form a 'paste'. Such electrically conductive materials can comprise carbon (e.g., graphite), metal, or metal oxide. Useful metal oxides include oxides of a metal selected from the group consisting of Ru, Pt, Ir, Sr, La, Nd, Ca, Cu, Bi, Gd, Mo, Nb, Cr and Ti.

In one embodiment of the present invention, an organic solvent is used to minimize water sorption and to improve intermixing of the solid components. Organic solvents useful in the practice of the present invention include any liquid capable of suspending or dissolving the polyimide component, the epoxy component or both components. These organic solvents can have a Hanson polar solubility parameter between (and optionally including) any two of the following numbers 2.1, 2.2, 2.3, 2.4, 2.5, 2.6, 2.7, 2.8, 2.9 and 3.0 and can have a normal boiling point between (and optionally including) any two of the following temperatures: 210, 220, 230, 240, 250 and 260° C.

In one embodiment of the present invention, the binder component (i.e., the polyimide component and the epoxy component), and optionally, an electrically conductive material is combined with an appropriate organic solvent to form a paste. As used herein a "paste" is intended to include solutions, suspensions or otherwise a homogeneous or non-homogeneous inter-mixing or blending of either a polyimide/epoxy component or a polyimide/epoxy component also comprising electrically conductive materials and other optional materials.

In one embodiment of the present invention, the binder component can be combined with a thermal cross-linking agent. In another embodiment, the polyimide component (and/or epoxy component) can further comprise a crosslinkable site (by incorporation of a monomer capable of chemically crosslinking) in the polymer backbone of that material. Crosslinking can make the polymer more rigid and/or improve its solvent resistance. In some embodiments of the present invention, it may be useful for the pastes disclosed herein to further comprise a blocked isocyanate, an adhesion promoter, and/or other useful inorganic fillers (including but not limited to other metals or metal oxides).

The present invention is also directed to embodiments where the polyimide component has a glass transition temperature greater than (and optionally greater than and equal to): 250, 260, 270, 280, 290 or 300° C. and the solvent component is capable of solvating or at least softening the polyimide component.

The term, "positive moisture solubility" is intended to define a polyimide/epoxy solution containing 10% solids that is stable in an environment with a relative humidity of about 85% for a period greater than or equal to eight (8) hours at room temperature. The moisture solubility measurement is a test Applicants used to measure the polyimide/epoxy solution stability in a high moisture environment. The stability of the polyimide/epoxy solutions in high moisture environments is important because processing of the liquid or paste compositions, which involves ingredient mixing, 3 roll milling and screen printing, can take from 2 hours and up to 8 hours. During this time, the polyimide component or epoxy component generally should not precipitate by greater than 25, 20, 15, 12, 10, 8, 6, 4, 2, 1, 0.5, or 0.1 percent in the liquid or paste compositions.

The compositions of the present invention can generally be used in many types of electronic circuitry type applications. In particular, the compositions can generally be used to produce electronic components such as resistors, but can also be used as discrete or planar capacitors, inductors, encapsulants, conductive adhesives, dielectric films and coatings, and electrical and thermal conductors.

In one embodiment, the present invention is directed to low water sorption, stable polyimide-based pastes that comprise certain hydrophobic epoxies. These materials can be used to prepare resistor materials, capacitors, and other electronic materials. The compositions of the present invention can be applied to a variety of substrate materials to make embedded passive-type resistors or other related planar (either embedded or non-embedded) electronic components. One type of electronic component is a polymer thick film (PTF) resistor. These resistors are typically formed using screen-printable liquids or pastes.

In one embodiment of the present invention, a PTF resistor composition is made from a screen-printable resistor paste composition of the present invention. The resistor paste composition is derived from a polyimide-based paste, a hydrophobic epoxy and an electrically conductive material (e.g., metal oxides and/or carbon, graphites, and carbon nanotube, and carbon nanofiber materials).

The PTF resistor paste can be applied on a suitable substrate using screen-printing (including stencil printing) or any other similar-type technique. Following a drying process, the printed pastes can be cured at relatively low temperatures to remove the solvent. The paste will tend to shrink and compress the conductive particles together, resulting in electrical conductivity between the particles. The electrical resistance of the system tends to depend on the resistance of the materials incorporated into the polymer binder, their particle sizes and loading, as well as the nature of the polymer binder itself.

The electrical resistance of a PTF resistors formed in this fashion is very much dependent on the distances between the electrically conductive particles. The PTF resistors of the present invention require physical stability of the polymer binder when exposed to high temperatures and high moisture environments.

PTF resistor stability can be measured by several known test measurements, including exposing the resistor to environments at 85° C. and 85% relative humidity to show accelerated aging, thermal cycling performance, as well as resistance to the exposure of soldering materials. The high performance PTF resistors of the present invention will typically exhibit little, if any, meaningful change in resistance following these tests. PTF materials may also encounter multiple exposures to solder with wave and re-flow solder operations.

For PTF resistors, the addition of an epoxy component can improve adhesion to chemically cleaned copper or other metals. This improvement in adhesion can greatly improve the performance of PTF resistors to solder exposure and to accelerated thermal aging. Both thermal cycling, from −25° C. to +125° C., and for 85° C./85% RH thermal cycling performance was significantly improved. The combinations of the polyimides and the epoxies disclosed herein can improve PTF resistors sufficiently that the expensive multi-step immersion silver treatment of a copper (or other metals) may not be necessary.

In many applications (depending upon the particular design requirements of any particular embodiment of the present invention), the resistor films of the present invention can oftentimes provide a sufficiently stable and reliable interface when bonded directly to a copper trace, simply referred to herein as "non metal-plated copper" (e.g., no silver immersion plating process applied to the copper prior to resistor film application). The omission of the silver-plating process will tend to lower overall cost and complexity in the use of the present invention.

Polyimides are generally prepared from a dianhydride, or the corresponding diacid-diester, diacid halide ester, or tetracarboxylic acid derivative of the dianhydride, and a diamine. For purposes of the present invention, particular dianhydrides and a particular range of particular diamines were discovered to be useful in the preparation of a water-resistant imide.

Generally, the polyimide component of the present invention can be represented by the general formula,

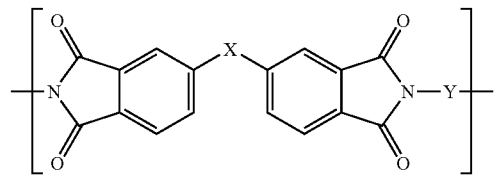

where X can be equal to $SO_2$ or $C(CF_3)_2$. $C(CF_3)_2C(CF_3)$ phenyl, $C(CF_3)CF_2CF_3$, $C(CF_2CF_3)$phenyl (and combinations thereof); and where Y is derived from a diamine component comprising from 2 to 50 mole percent of a phenolic-containing diamine selected from the group consisting of 2,2'-bis(3-amino-4-hydroxyphenyl) hexafluoropropane (6F-AP), 3,3'-dihydroxy-4,4'-diaminobiphenyl (HAB), 2,4-diaminophenol, 2,3-diaminophenol, 3,3'-diamino-4,4'-dihydroxy-biphenyl, and 2,2'-bis(3-amino-4-hydroxyphenyl) hexafluoropropane.

Diamines useful in comprising the remaining portion of the diamine component (i.e., that portion comprising from about 50 to 98 mole percent of the total diamine component) can be 3,4'-diaminodiphenyl ether (3,4'-ODA), 4,4'-diamino-2,2'-bis(trifluoromethyl)biphenyl (TFMB), 3,3',5,5'-tetramethyl-benzidine, 2,3,5,6-tetramethyl-1,4-phenylenediamine, 3,3'-diaminodiphenyl sulfone, 3,3'dimethylbenzidine, 3,3'-bis(trifluoromethyl)benzidine, 2,2'-bis-(p-aminophenyl)hexafluoropropane, bis(trifluoromethoxy)benzidine (TFMOB), 2,2'-bis(pentafluoroethoxy)benzidine (TFEOB), 2,2'-trifluoromethyl-4,4'-oxydianiline (OBABTF), 2-phenyl-2-trifluoromethyl-bis(p-aminophenyl)methane, 2-phenyl-2-trifluoromethyl-bis(m-aminophenyl)methane, 2,2'-bis(2-heptafluoroisopropoxy-tetrafluoroethoxy)benzidine (DFPOB), 2,2-bis(m-aminophenyl)hexafluoropropane (6-FmDA), 2,2-bis(3-amino-4-methylphenyl)hexafluoropropane, 3,6-bis(trifluoromethyl)-1,4-diaminobenzene (2TFMPDA), 1-(3,5-diaminophenyl)-2,2-bis(trifluoromethyl)-3,3,4,4,5,5,5-heptafluoropentane, 3,5-diaminobenzotrifluoride (3,5-DABTF), 3,5-diamino-5-(pentafluoroethyl)benzene, 3,5-diamino-5-(heptafluoropropyl)benzene, 2,2'-dimethylbenzidine (DMBZ), 2,2',6,6'-tetramethylbenzidine (TMBZ), 3,6-diamino-9,9-bis(trifluoromethyl)xanthene (6FCDAM), 3,6-diamino-9-trifluoromethyl-9-phenylxanthene (3FCDAM), 3,6-diamino-9,9-diphenyl xanthene. These diamines can be used alone or in combination with one another.

Generally speaking, the present inventors found that if less than about 2 mole percent (of the total diamine component) comprises phenolic containing diamines, the polyimide formed may not be capable of sufficiently crosslinking with the epoxy component. In addition, if more than about 25, 30, 35, 40, 45 or 50 mole percent of the diamine component is a phenolic containing diamine, the polyimide may be highly susceptible to unwanted water absorption. As such, the diamine component of the present invention can typically comprises from about 2, 3, 4, 5, 6, 7, 8, 9, or 10 mole percent phenol containing diamine to about 25, 30, 35, 40, 45 or 50 mole percent of a phenolic-containing diamine to be effective.

The polyimides of the invention are prepared by reacting a suitable dianhydride (or mixture of suitable dianhydrides, or the corresponding diacid-diester, diacid halide ester, or tetracarboxylic acid thereof) with one or more selected diamines.

The mole ratio of dianhydride component to diamine component is preferably from between 0.9 to 1.1. Preferably, a slight molar excess of dianhydrides can be used at mole ratio of about 1.01 to 1.02. End capping agents, such as phthalic anhydride, can be added to control chain length of the polyimide.

Some dianhydrides found to be useful in the practice of the present invention, i.e., to prepare the polyimide component, can be 3,3',4,4'-diphenylsulfone tetracarboxylic dianhydride (DSDA), 2,2-bis(3,4-dicarboxyphenyl)1,1,1,3,3,3-hexafluoropropane dianhydride (6-FDA), 1-phenyl-1,1-bis(3,4-dicarboxyphenyl)-2,2,2-trifluoroethane dianhydride, 1,1,1,3,3,4,4,4-octylfluoro-2,2-bis(3,4-dicarboxyphenyl)butane dianhydride, 1-phenyl-2,2,3,3,3-pentafluoro-1,1-bis(3,4-dicarboxylphenyl)propane dianhydride, 4,4'-oxydiphthalic anhydride (ODPA), 2,2'-bis(3,4-dicarboxyphenyl)propane dianhydride, 2,2'-bis(3,4-dicarboxyphenyl)-2-phenylethane dianhydride, 2,3,6,7-tetracarboxy-9-trifluoromethyl-9-phenylxanthene dianhydride (3FCDA), 2,3,6,7-tetracarboxy-9,9-bis(trifluoromethyl)xanthene dianhydride (6FCDA), 2,3,6,7-tetracarboxy-9-methyl-9-trifluoromethylxanthene dianhydride (MTXDA), 2,3,6,7-tetracarboxy-9-phenyl-9-methylxanthene dianhydride (MPXDA), 2,3,6,7-tetracarboxy-9,9-dimethylxanthene dianhydride (NMXDA) and combinations thereof. These dianhydrides can be used alone or in combination with one another.

The present invention also comprises certain sterically hindered hydrophobic epoxies to make up the polyimide/epoxy component. While many epoxies are known to be hydrophobic, the present inventors found that only some of these epoxies provide good water resistance of cured, embedded resistors with accelerated aging testing at 85° C. and 85% RH. As used herein, these epoxies can be described as being 'sterically hindered'. As used herein, 'sterically hindered' means a polymer having a molecular structure whereby it is difficult for water (or a water molecule) to chemically associate with the backbone polymer.

Generally, some epoxies found to be useful in the practice of the present invention can be represented by the formula below, In the practice of the present invention an organic solvent is selected that can easily dissolve the polyimide component and which can be boiled off (later in processing) at a relatively low operating temperature. The polyimide component can typically be in the 'polyimide state' (i.e., as opposed to the polymer being in the polyamic acid, or other polyimide precursor state). As such, a lower processing temperature can be achieved (in order to dry the composition of solvent) provided that certain solvents disclosed herein are chosen to allow the polyimide/epoxy-based pastes of the present invention to possess sufficient resistance to moisture sorption, particularly during a screen-printing process.

Solvents known to be useful in accordance with the practice of the present invention include organic liquids having both (i.) a Hanson polar solubility parameter between and including any two of the following numbers 2.1, 2.2, 2.3, 2.4, 2.5, 2.6, 2.7, 2.8, 2.9 and 3.0, and (ii) a normal boiling point ranging from between and including any two of the following numbers 210, 220, 230, 240, 250 and 260° C. In one embodiment of the present invention, a useful solvent is selected from one or more dibasic acid ester solvents including, but not limited to, DuPont DBE® solvents including dimethyl succinate, dimethyl glutarate and dimethyl adipate. Other useful solvents include propyleneglycol diacetate (PGDA), Dowanol® PPh, butyl carbitol acetate, carbitol acetate and mixtures of these. Co-solvents may be added provided that the composition is still soluble, performance in screen-printing is not adversely affected, and lifetime storage is also not adversely affected.

In some embodiments, very little, if any, precipitation of the polyimide is observed when handling the paste composition. By using a partially or wholly soluble polyimide, there is generally no need to use a polyimide precursor (i.e., polyamic acid). If a polyamic acid were used, then higher temperatures would generally be necessary to convert the polyamic acid to a polyimide. By using a solvated polyimide, the solvent can be removed at a much lower temperature, thereby precipitating out the polyimide. In some embodiments, after the polyimide is precipitated, a much lower temperature (compared to the temperature necessary to convert a polyamic acid to a

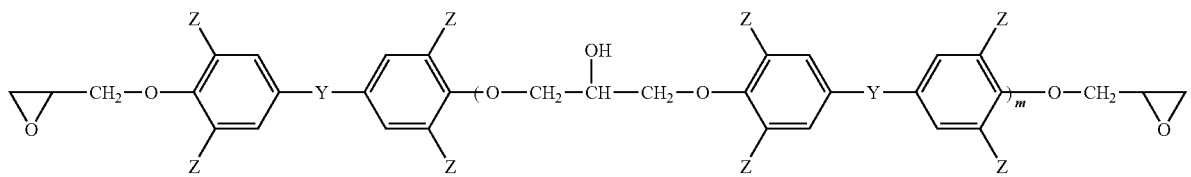

where z is an alkyl, alkoxy, phenyl, phenoxy, halogen, or combinations thereof; where Y is a covalent bond, oxygen, sulfur, methylene, fluorenylidene, ethylidene, sulfonyl, cyclohexylidene, 1-phenylethylidene, $C(CH_3)_2$, or $C(CF_3)_2$; and where m is an integer between, and including, 0 and 5. In one embodiment of the present invention, the epoxy component can be tetramethyl biphenol epoxy (TMBP), tetramethylbisphenol A (TMBPA), tetrabromobisphenol-A, or combinations of these. In one embodiment of the present invention an amount of epoxy component found to be useful, in relationship to the amount of polyimide component can be expressed by the following ratio A:B where A is the polyimide component and B is the epoxy component, and where A is between, and including, any two of the following numbers 1, 2, 3, 4, 5, 10, 12 and 15, and where B is 1.0.

polyimide) can be used to fuse the precipitated polyimide to form a sufficiently solidified layer.

In one embodiment of the present invention an electrically conductive material can be added to the polyimide/epoxy component to make these compositions useful as an electronic-grade paste. Generally, these electrically conductive materials can be in the form of a powder. Commonly used powders can be metals or metal oxides. Other common powders include common graphite materials and carbon powders. In another embodiment of the present invention, the electrically conductive material can be a reduced oxide of a metal selected from the group consisting of Ru, Bi, Gd, Mo, Nb, Cr and Ti. The term "metal oxide" can be defined herein as a mixture of one or more metals with an element of Groups IIIA, IVA, VA, VIA or VIIA of the Periodic Table. In particular, the term metal oxides can include metal carbides, metal nitrides, and metal borides, titanium nitride and carbide, zirconium boride and carbide and tungsten boride.

In general, the amount of electrically conductive material added to a composition depends on the end use application (e.g., either the electrical conductivity or resistivity desired). In general, one amount of electrically conductive material found to be useful can range between (and optionally including) any two of the following numbers, 10, 15, 20, 25, 30, 35, 40, 45, 50, 55, 60, 65, 70, 75 and 80 weight percent of the total dry weight of the composition. Typically ruthenium oxides, or complex metals having ruthenium in them, can be used to prepare compositions having a lower electrical resistivity. In 'higher range' electrical resistivity applications, titanium nitride and carbide, zirconium boride and carbide, and tungsten boride, can be used.

Because screen-printing is often the method of choice for PTF resistors, a paste in accordance with the present invention must generally remain stable for reasonably long exposures to ambient moisture (i.e., while the paste resides on the screen). If the polyimide/epoxy solution is not stable to moisture absorption, the polyimide component can precipitate (which is undesirable), making the paste unusable and thereby requiring considerable effort to remove the residual 'damaged paste' from the screen. Additionally, excessive water uptake can also cause the paste's viscosity to drift, thus altering the printed resistor thickness and ultimately the cured resistance.

Polyimides in general are insoluble. The few polyimides that are soluble are only soluble in select polar organic solvents. But, many polar organic solvents act like a sponge and absorb water from the ambient environment. Often, the relative humidity of an atmosphere is sufficiently high enough that water absorption into the composition is significant. The water in the composition and in the polyimide solutions can cause the polyimide to precipitate, which essentially renders the composition unusable for most purposes. The composition must be discarded, and the screen may be damaged in attempts to remove intractable paste plugging the holes in the screen.

The polyimides of the present invention can be made by thermal and chemical imidization using a different solvent as otherwise described herein. The polyimide component can be removed from the solvent by precipitation in a non-solvent such as methanol, then re-dissolved in a solvent disclosed earlier herein. Using a thermal method, the dianhydride can be added to a solution of the diamine in any of the following polar solvents, m-cresol, 2-pyrrolidone, N-methylpyrrolidone (NMP), N-ethylpyrrolidone, N-vinylpyrrolidone), N,N'-dimethyl-N,N'-propylene urea (DMPU), cyclohexylpyrrolidone (CHP), N,N-dimethylacetamide (DMAc), N,N-dimethylformamide (DMF) and γ-butyrolactone (BLO). The reaction temperature for preparation of the polyamic acid or polyamic acid ester is typically between 25° C. and 40° C.

Alternatively, the dianhydrides were dissolved in one of these solvents, and the diamines were added to the dianhydride solution.

After the polyamic acid (or polyamic acid ester) is produced, the temperature of the reaction solution is then raised considerably to complete the dehydration ring closure. The temperatures used to complete the ring closure are typically from 150° C. to 200° C. A high temperature can be used to assure converting the polyamic acid into a polyimide. Optionally, a co-solvent can be used to help remove the water produced during imidization (e.g., toluene, xylene and other aromatic hydrocarbons).

The chemical method includes the use of a chemical imidizing agent, which is used to catalyze the dehydration, or ring closing. Chemical imidization agents such as acetic anhydride and β-picoline can be used. The reaction solvent is not particularly limited so long as it is capable of dissolving the polyamic acid and polyimide. The resulting polyimide is then precipitated. This can be performed by adding the polyimide to a non-solvent. These non-solvents can be methanol, ethanol, or water. The solid is washed several times with the non-solvent, and the precipitate is oven dried.

Polyimides of the present invention can be made to be crosslinkable by using one or more aromatic diamines with one or more phenolic hydrogens. Some of these aromatic diamines can be 3,3'-dihydroxy-4,4'-diaminobiphenyl (HAB), and 2,2'-bis(3-amino-4-hydroxyphenyl) hexafluoropropane (6F-AP). The phenolic functionality reacts with one or more other crosslinking agent during curing. Only a small amount of cross-linking aromatic diamine is generally needed to provide an improvement in mechanical strength in the cured material. In fact, if too much of the cross-linking diamine is used, the resulting polyimide will tend to have more moisture sensitivity.

In one embodiment of the present invention, a sterically hindered phenol can be used as a cross-linking agent for the epoxy component. The phenol can be added as an additional component to the polyimide component and the epoxy component. Examples of specific sterically hindered phenols found to be useful include, but are not limited to, 3,3',5,5'-tetramethylbiphenol-4,4'-diol, 4,4'-isopropylidenebis(2,6-dimethylphenol), and 4,4'-isopropylidenebis(2,6-dibromophenol). In one embodiment of the present invention, the amount of sterically hindered phenols added to the polyimide/epoxy component is between about 0.6 to 3.0 mole percent of the amount of sterically hindered epoxy component. In another embodiment, a useful phenol can be represented by the general formula,

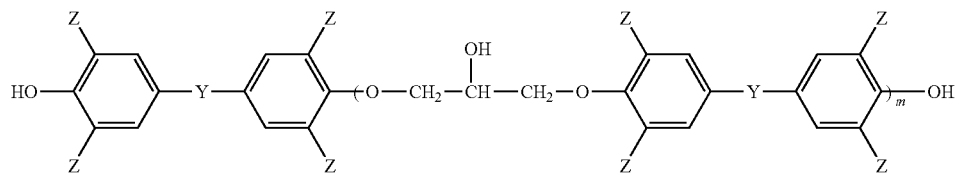

where Z is an alkyl, alkoxy, phenyl, phenoxy, halogen or combinations thereof, where Y is a covalent bond, oxygen, sulfur, methylene, fluorenylidene, ethylidene, sulfonyl, cyclohexylidene, 1-phenylethylidene, $C(CH_3)_2$, or $C(CF_3)_2$, and where m is an integer between and including 0, 1, 2, 3, 4 and 5.

Paste compositions containing the polyimides and epoxies of the invention can be used in multiple electronic applications. In one embodiment, the liquid and paste compositions of the invention will include a polyimide with a glass transition temperature greater than 250° C., 280° C., or 310° C. In one embodiment, the compositions will also comprise a polyimide with a water absorption factor of 2% or less, preferably 1.5% or less, and more preferably 1% or less. The polyimides used in the composition will also exhibit a positive solubility measurement in an organic solvent.

Thick film compositions of the present invention can be applied to a substrate by screen printing, stencil printing, dispensing, doctor-blading into photoimaged or otherwise preformed patterns, or other techniques known to those skilled in the art. These compositions can also be formed by any of the other techniques used in the composites industry including pressing, lamination, extrusion, molding, and the like.

When a thick film composition of the present invention is applied to a substrate by means of screen-printing, an appropriate viscosity is necessary so that the thick film can be passed through the screen readily. In addition, the thick film should be sufficiently thixotropic so the thick film can set up rapidly after being screened to thereby provide desired resolution. In addition to the rheological properties, the organic solvent should also provide appropriate wettability of the solids and the substrate, a good drying rate, and a film strength sufficient to withstand rough handling.

Curing of a final paste composition is accomplished by any number of standard curing methods including convection heating, forced air convection heating, vapor phase condensation heating, conduction heating, infrared heating, induction heating, or other techniques known to those skilled in the art. In one embodiment of the present invention, a catalyst can be used to aid in curing of a polymer matrix. Useful catalysts of the present invention include, but are not limited to, blocked or unblocked tertiary aromatic amine catalysts. Examples of these catalysts include dimethylbenzylammonium acetate, dimethylbenzylamine, and benzimidazole.

In some applications, a crosslinkable polyimide or a crosslinkable epoxy can be advantageous in a liquid or paste formulation. For example, the ability of the polyimide to crosslink with crosslinking agents during a thermal cure can provide electronic coatings with enhanced thermal and humidity resistance. The resulting cross-linked polyimide can stabilize the binder matrix, raise the Tg, increase chemical resistance, or increase thermal stability of the cured coating compositions. Depending upon the application, polyimides that contain no crosslinking functionality can be useful, although they will tend to have a lower Tg (of the polyimide) and a higher moisture absorption (of the polyimide).

In yet another embodiment of the present invention, a thermal crosslinking agent is added to the polyimide/epoxy formulation (typically a polyimide/epoxy solution) to provide additional crosslinking functionality. A highly cross-linked polymer, after a thermal curing cycle, can yield electronic coatings with enhanced thermal and humidity resistance. The effect of thermal crosslinking agent is to stabilize the binder matrix, raise the Tg of the binder composite, increase chemical resistance, and increase thermal resistance of the cured, final coating composition.

Some useful thermal crosslinkers suitable for the present invention include blocked isocyanates and polyhydroxystyrene. Blocked isocyanates can react with hydroxyls including those resulting from the epoxy-crosslinkable polyimide reaction. Polyhydroxystyrene can react with the epoxy functionality in the epoxy-containing resin.

Other preferred thermal crosslinking agents are selected from the group consisting an epoxidized copolymer of phenol and aromatic hydrocarbon, a polymer of epichlorohydrin and phenol formaldehyde, and 1,1,1-tris(p-hydroxyphenyl) ethane triglycidyl ether.

In one embodiment of the present invention, the polyimide/epoxy component can be combined with other functional fillers for form different types of electronic materials. For example, functional fillers for capacitors include, but are not limited to, barium titanate, barium strontium titanate, lead magnesium niobate, and titanium oxide. Functional fillers for encapsulants include, but are not limited to, talc, fumed silica, silica, fumed aluminum oxide, aluminum oxide, bentonite, calcium carbonate, iron oxide, titanium dioxide, mica and glass. Encapsulant compositions can be unfilled, with only the organic binder system used, which has the advantage of providing transparent coatings for better inspection of the encapsulated component. Functional fillers for thermally conductive coatings include, but are not limited to barium nitride, aluminum nitride, aluminum oxide coated aluminum nitride, silicon carbide, boron nitride, aluminum oxide, graphite, beryllium oxide, silver, copper, and diamond.

PTF materials have received wide acceptance in commercial products, notably for flexible membrane switches, touch keyboards, automotive parts and telecommunications. In one embodiment of the present invention, a resistor (or resistive element) is prepared by printing a PTF composition, or ink, onto a sheet in a pattern. Here, it can be important to have uniform resistance across the sheet (i.e., the resistance of elements on one side of the sheet should be the same as that of elements on the opposite side). Variability in the resistance can significantly reduce yield. The resistive element should be both compositionally and functionally stable. Obviously, one of the most important properties for a resistor is the stability of the resistor over time and under certain environmental stresses. The degree to which the resistance of the PTF resistor changes over time or over the lifetime of the electronic device can be critical to performance. Also, because PTF resistors are subject to lamination of inner layers in a printed circuit board, and to multiple solder exposures, thermal stability is needed. Although some change in resistance can be tolerated, generally the resistance changes need to be less than 5%.

Resistance can change because of a change in the spacing or change in volume of functional fillers, i.e., the resistor materials in the cured PTF resistor. To minimize the degree of volume change, the polyimide component and the epoxy component (i.e., the polyimide/epoxy component) should have low water absorption so the cured polyimide based material does not swell when exposed to moisture. Otherwise, the spacing of the resistor particles will change resulting in a change in resistance.

Resistors also need to have little resistance change with temperature in the range of temperatures the electronic device is likely to be subjected. The thermal coefficient of resistance must be low, generally less than 200 ppm/° C.

The compositions of the present invention can be especially suitable for providing polymer thick film (PTF) resistors. The PTF resistors made from the inventive polyimides and corresponding compositions exhibit exceptional resistor properties and are thermally stable even in relatively high moisture environments.

The liquid or paste compositions of the present invention can further include one or more metal adhesion agents. Preferred metal adhesion agents are selected from the group consisting of polyhydroxyphenylether, polybenzimidazole, polyetherimide, polyamideimide, 2-amino-5-mercaptothiophene, 5-amino-1,3,4-thiodiazole-2-thiol, benzotriazole, 5-chloro-benzotriazole, 1-chloro-benzotriazole, 1-carboxy-benzotriazole, 1-hydroxy-benzotriazole, 2-mercaptobenzoxazole, 1H-1,2,4-triazole-3-thiol, and mercaptobenzimidazole. Typically, these metal adhesion agents are dissolved in the polyimide solutions of the present invention.

In one embodiment of the present invention, the compositions can also be dissolved into a solution and used in integrated circuit chip-scale packaging and wafer-level packaging. These compositions can be used as semiconductor stress buffer, interconnect dielectric, protective overcoat (e.g., scratch protection, passivation, etch mask, etc.), bond pad redistribution, an alignment layer for a liquid crystal display, and solder bump under fills.

The advantages of the materials present invention are illustrated in the following examples. Processing and test procedures used in preparation of, and testing, of the polyimides of the present invention (and compositions containing these polyimides) are described below.

3 Roll Milling

A three-roll mill is used for grinding pastes to fineness of grind (FOG) generally <5μ. The gap is adjusted to 1 mil before beginning. Pastes are typically roll-milled for three passes at 0, 50, 100, 150, 200, 250 psi until FOG is <5μ. Fineness of grind is a measurement of paste particle size. A small sample of the paste is placed at the top (25μ mark) of the grind gauge. Paste is pushed down the length of the grind gauge with a metal squeegee. FOG is reported as x/y, where x is the particle size (microns) where four or more continuous streaks begin on the grind gauge, and y is the average particle size (micron) of the paste.

Screen-Printing

A 230 or 280 mesh screen and a 70-durometer squeegee are used for screen-printing. Printer is set up so that snap-off distance between screen and the surface of the substrate is typically 35 mils for an 8 in×10 in screen. The downstop (mechanical limit to squeegee travel up and down) is preset to 5 mil. Squeegee speed used is typically 1 in/second, and a print-print mode (two swipes of the squeegee, one forward and one backward) is used. A minimum of 20 specimens (per paste) was printed. After all the substrates for a paste are printed, they are left undisturbed for a minimum of 10 minutes (so that air bubbles can dissipate), then cured 1 hr at 170° C. in a forced draft oven.

Solder Float

Samples are solder floated in 60/40 tin/lead solder for 3 times for 10 seconds each, with a minimum of 3 minutes between solder exposures where the samples are cooled close to room temperature.

85° C./85% RH Testing

A minimum of three specimens that have not been cover coated are placed in an 85° C./85% RH chamber and aged for 125, 250, 375 and 500 hr at 85/85. After exposure time is reached, samples are removed from the chamber, oxidation is removed from the copper leads with a wire brush and the resistance promptly determined.

Thermal Cycling

Samples of cured resistors that have not been cover coated are subjected to thermal cycling from −25° C. to +125° C. for 150 to 200 cycles with heating and cooling rates of 10° C./min with samples held at the extreme temperatures for 30 min.

ESD

Samples of cured resistor are exposed to 5,000 instantaneous volts of electricity five times. Voltage is decreased to 2,000 volts and the sample is exposed to 10 repetitions. The resistance change (as a resistor) is measured.

TCR

TCR (thermal coefficient of resistance) is measured and reported in ppm/° C. for both hot TCR(HTCR) at 125° C. and cold TCR(CTCR) at −40° C. A minimum of 3 specimens for each sample, each containing 8 resistors, is used. The automated TCR averages the results.

Thermal Conductivity Measurement

A film ~0.3 mm is prepared on releasing paper by solution cast, followed by drying at 170° C. for 1 hour. A 1" diameter puncher is used to cut the sample into the right size. For the thermal conductivity determination a laser flash method is used to determine the thermal conductivity. Samples are sputtered with ~200 Å of Au layer in order to block the laser flash being seen by the IR detector during the measurement. The gold coating is then sprayed with three coats of micronically fine synthetic graphite dispersion in Fluoron®. The graphite coating increases the absorption of radiation on the laser side of the sample, and increases the emission of radiation on the detector side.

The specific heat is determined first by comparing with that of a standard (Pyrex® 7740), and then corrected by subtracting those of gold and graphite coatings. The bulk density is calculated based on the formulation. Thermal diffusivity in the unit of cm/s is obtained via a Netzsh laser flash instrument. The thermal conductivity is calculated as:

$$\text{Conductivity} = (\text{Diffusivity} \times \text{Density} \times \text{Specific Heat})$$

Temperature is controlled at 25° C. via a Neslab circulating batch. Scan time is set at 200 ms with an amperage gain of 660 for Pyrex® standard and 130-200 second and 600 gain for the sample. A Nd:glass laser of 1060 nm and pulse energy of 15 J and pulse width of 0.33 ms is used. Three laser shots are taken for each sample.

Stability of Polyimide Solutions in the Presence of Water Vapor 0.4 to 0.5 grams of 10% solids solutions of the polyimide are placed in a 1 inch diameter watch glass and placed in a 130 mm diameter desiccator that contains an aqueous saturated solution of ammonium sulfate which gives 75% to 85% RH the closed container. The samples are observed and the time where the sample becomes cloudy or opaque or when a ring of precipitated polymer is recorded. The polyimide sometimes precipitates on the outside edge first where the solution depth is the least, and with time precipitation occurs across the entire sample. Polyimide solutions that resist precipitation for the longest time will yield paste compositions with the longest self-life stability to high humidity conditions. Solutions of polyimide that do not precipitate in 8 hours exposure are said to have a positive solubility measurement. A hygrometer from Extech Instruments is placed in the desiccator to monitor the % RH.

Polyimide Film Moisture Absorption Test

The ASTM D570 method is used where polyimide solution is coated with a 20-mil doctor knife on a glass plate. The wet coating is dried at 190° C. for about 1 hour in a forced draft oven to yield a polyimide film of 2 mils thickness. In order to obtain a thickness of greater than 5 mils as specified by the test method, two more layers are coated on top of the dried polyimide film with a 30 min 190° C. drying in a forced draft oven between the second and third coating. The three layer coating is dried 1 hr at 190° C. in a forced draft oven and then is dried in a 190° C. vacuum oven with a nitrogen purge for 16 hrs or until a constant weight is obtained. The polyimide film is removed from the glass plate and cut into one inch by 3-inch strips. The strips are weighed and immersed in deionized water for 24 hrs. Samples are blotted dry and weighed to determine the weight gain so that the percent water absorption can be calculated.

METHODS OF THE PRESENT INVENTION

In the present invention, there is provided a process for forming stable embedded resistors on organic inner layer circuit boards. The resistors are capable of a wide range of resistance values, yet can be processed in a manner that does not adversely affect the organic substrate or entail complicated processing. Resistors formed in accordance with this invention can be buried in a multi-layer circuit board. As described below, the present methods are an improvement both on the conventional methods of embedding passive elements, and on the methods described in U.S. Pat. No. 6,631,551.

The method of this invention generally entails the preparation and use of cross-linkable polyimide thick film resistor pastes of the type described in this invention. These thick film pastes are then applied to an electrically conductive foil, such as copper, and then heated to bond the thick film material to the foil, to cure the polyimide thick film matrix, and to remove the screen printing solvent. The conductive foil with the cured discrete resistors is then laminated component side down to an organic substrate, such that the resistors contact the organic substrate and are preferably embedded in the organic substrate. The foil is then etched to form at least one of the terminations that contact the solid mass and thereby complete the passive electrical component. Those skilled in the art will appreciate that numerous variations and modifications are possible, and such variations and modifications are within the scope of this invention.

The resistive mass may be trimmed in accordance with known practices to more precisely obtain the desired resistance value for the resistor.

Finally the resulting inner layer or composite core may be laminated with other layers of materials of the type used to form organic circuit boards. The sequence of layup of these materials may result in the passive electrical component being buried or remaining on the substrate surface.

The thick film resistors are formed with cross-linkable polyimide thick film resistor pastes described in this invention. With these pastes, the instability of conventional polymer thick film resistors printed directly on copper without the use of immersion silver pretreatments is overcome. These pastes may be cured using a heating schedule compatible with organic circuit board materials or, since the curing step occurs on copper foil, may be cured more aggressively with an extended cure at a temperature and time that is generally incompatible with conventional organic circuit boards.

Copper foil is the preferred substrate in this invention, vs. other foils such as stainless steel, because of its low bulk resistivity. The organic substrates in this invention can be any number of materials known and used in the art, a particularly notable example of which is FR-4, a glass-reinforced epoxy resin laminate available from various sources.

Conventional Method of Embedding Resistors

The conventional method of embedding passive elements is illustrated in FIG. 1A. As shown, a standard inner layer laminate is provided. The copper is then masked and etched to pre-pattern termination pads and circuit traces. The resistor paste is screen printed, overlapping termination pads, and then cured. Then, using standard processes, the PWB (Printed Wiring Board) is built. In other words, the process starts with standard double sided core (FR-4 plastic with Cu foil laminated on each side. The copper is then etched to form the inner layer circuit traces. After this, the polymer thick film resistor ink is screen printed between the traces at predesignated places, generally on Cu pads designed to accept the paste. The printed inner layer is then placed in an oven to cure the resistor paste. Ultimately, the cured paste and the copper terminations on which it is printed form the resistive element. The cured inner-layer is then laminated with additional prepreg and copper foil to embed the resistors within the layers of the circuit board.

Cured-on-Foil Method of Embedding Resistors

As illustrated in FIG. 1B, in the cured-on-foil method, polyimide thick film resistor paste described herein is printed and cured on copper foil. The foil is then laminated, component side down, to single sided FR-4 Core, using FR-4 Prepreg. The foil is then masked and etched to open up resistors, and pattern circuit traces. Standard processes are then used to complete the PWB. In other words, the resistors are initially screen printed and cured on copper foil. To form the inner layer, this foil is then laminated, component side down, to prepreg. Another piece of copper foil is optionally used on the back side to generate another signal layer as shown in the second step above. This laminate is then subjected to a "Riston" or similar mask and etch process in which the copper is etched to "open" the resistors and generate the copper terminations which complete the resistive elements. This inner layer is then laminated with prepreg and foil to embed the resistor is the board.

EXAMPLE 1

Synthesis of Composition Useful in the Present Invention

A polyimide was prepared by conversion of a polyamic acid to polyimide with chemical imidization. To a dry three neck round bottom flask equipped with nitrogen inlet, mechanical stirrer and condenser was added 800.45 grams of DMAC, 89.98 grams of 3,3'-bis-(trifluoromethyl)benzidine (TFMB), 3.196 grams 3,3'-dihydroxy-4,4'-diaminobiphenyl (HAB) and 0.878 grams of phthalic anhydride (to control molecular weight).

To this stirred solution was added over one hour 104.87 grams of 3,3',4,4'-diphenylsulfone tetracarboxylic dianhydride (DSDA). The solution of polyamic acid reached a temperature of 33° C. and was stirred without heating for 16 hrs. 119.56 grams of acetic anhydride were added followed by 109.07 grams of 3-picoline and the solution was heated to 80° C. for 1 hour.

The solution was cooled to room temperature, and the solution added to an excess of methanol in a blender to precipitate the product polyimide. The solid was collected by filtration and was washed 2 times by re-blending the solid in methanol. The product was dried in a vacuum oven with a nitrogen purge at 150° C. for 16 hrs to yield 188.9 grams of product having a number average molecular weight of 46,300 and a weight average molecular weight of 93,900. The molecular weight of the polyimide polymer was obtained by size exclusion chromatography using polystyrene standards. Some of the phenolic groups were acetylated under the conditions used to chemically dehydrate the poly(amic acid) as determined by NMR analysis.

The polyimide was dissolved at 20% solids in a 60/40 weight/weight mixture of propyleneglycol diacetate (PGDA)/Dowanol® PPh.

EXAMPLE 2

Synthesis of Composition Used in Conventional Embedding Process But does not Work in Cured-on-Foil Process A polyimide based on 6FDA, TFMB, 6FAP, aminopropyl polydimethylsiloxane oligomer with Mn=1200 g/m (amine mole ratio=80/10/10) was prepared according to the procedure in Example 1. The solvent used for the poly(amic acid) synthesis was a cosolvent of DMAC and anhydrous tetrahydrofuran (THF) in a weight ratio of 60/40 DMAC/THF. The yield was 181 g, the number average molecular weight was 48,500 g/m according to GPC analysis, the weight average molecular weight was 110,000 g/m. The polyimide was dissolved at 20% solids in DBE-2. The polyimide was also dissolved at 20% solids by weight in butyl carbitol acetate.

EXAMPLE 3

Synthesis of Composition Useful in the Present Invention

A polyimide based on 6FDA, TFMB, and 6F-AP (90/10 amine molar ratio) was prepared according to the procedure in Example 1. The yield was 185 g, the number average molecular weight was 44,200 g/m according to GPC analysis, the weight average molecular weight was 93,000 g/m. The polyimide was dissolved at 20% solids in butyl carbitol acetate.

EXAMPLE 4

Synthesis of Composition Useful in the Present Invention

A polyimide based on 6FDA, TFMB, and 6F-AP (75/25 amine molar ratio) was prepared according to the procedure in Example 1. The yield was 178 g, the number average molecular weight was 39,600 g/m according to GPC analysis, the weight average molecular weight was 84,700 g/m. The polyimide was dissolved at 20% solids in butyl carbitol acetate.

EXAMPLE 5

Resistor Paste Prepared from the Composition in Example 3

A PTF resistor paste composition was prepared by adding, to the polyimide solution in Example 3, the additional components listed below. The PTF resistor paste included one or more metal powders (or metal oxides), hydrophobic thermal crosslinkers, and an aromatic amine catalyst. The PTF resistor paste composition was prepared by mixing the following ingredients in an ambient environment with stirring to give a crude paste mixture.

| Ingredient | % by weight |
| --- | --- |
| Ruthenium dioxide powder | 22.4 |
| Bismuth ruthenate powder | 11.8 |
| Graphite | 1.5 |
| Alumina powder | 13.8 |
| Polyimide | 9.8 |
| RSS-1407 | 1.0 |

-continued

| Ingredient | % by weight |
| --- | --- |
| Dimethylbenzylamine | 0.17 |
| butyl carbitol acetate | 39.53 |

The PTF resistor paste was 3-roll milled with a 1 mil gap with 3 passes each set at 0, 50, 100, 200, 250 and 300 psi pressure to yield a fineness of grind of 3/2.

EXAMPLE 6

Cured-on-Foil Lamination of Resistor Paste in Example 5

The resistor paste of Example 5 was printed on the treated side of 12" by 18" one oz. PLSP copper foils using a 230 mesh screen. It is likely that many different types of foils would work in this application, this is simply an example of one possibility that has been investigated. Regardless of the foil chosen, it is preferable to print the resistors on the treated side of the foil because this enhances adhesion and provides for intimate electrical contact between the printed resistor and the copper foil. After 5 min leveling time, the resistors were cured in a convection oven at 170° C. for 1 hr under a nitrogen atmosphere.

After curing the printed foils, inner layers were prepared. The construction contained the following layers: printed resistor foil component side down, 2 layers of 1080 prepreg, 1 layer of 7628, another layer of 1080, then 1 oz JTCS Insulectro copper foil with the treated side facing the 1080 prepreg. Five inner layer stacks were assembled in a "book", each was separated by release film and separator plates. The assembled book was vacuum laminated according to the following schedule:

Insert thermocouples in center of book, slide completed book in vacuum bag and seal; Begin vacuum; Preheat press to 350° F.; Load press, apply 5000 psi contact pressure when stack temperature reaches 75° C.; Allow stack temperature to reach 150° C.; Apply 130,000 lbs (approx. 300 psi); Allow stack temperature to reach 350° F.; After reaching 350° F., maintain temperature and pressure for 80 min; Turn off vacuum and start cooling process; When temperature reaches 200° F., apply water cool; Pressure is maintained until full cool.

It can be recognized by one skilled in the art that there are many possible combinations of materials that will yield perfectly acceptable constructions. This example is simply one combination that has been evaluated.

The laminated inner layer was then subjected to the Riston process to mask and etch the printed copper foils to "open up" the resistors. First, the fiducials needed to be exposed for subsequent alignment of the termination pattern. This is called a pre-etch step:

Microetch inner layer to generate a fresh copper surface; Apply Riston to both sides of inner layer (front and back); Apply tape over general area of fiducials; Image, then develop: area under tape is developed to reveal fiducials; Strip exposed (remaining) resist.

Reapply Riston to both sides of inner layer; Align termination (layer 2) artwork over resistors using exposed fiducials; Punch appropriate fiducials for eventual multi-layer lamination and registration; Expose layer 2 on front, and 100% of back; Develop pattern; Cu etch (alkaline etch); Strip remaining Riston; Dry finished inner layer.

The resistors now have isolated terminations and can be hand- or machine-probed if desired to obtain initial resistance readings.

The finished inner layers were then laminated to prepare 4-layer boards. Prior to lamination the inner layers were subjected to a Bondfilm pretreatment to improve adhesion. The four-layer boards were constructed with the following materials:

One oz. copper foil, treated side down, 2 layers of 1080 prepreg, inner layer panel containing resistors (component side up), 2 layers of 1080, then another one oz. copper foil, treated side up. This stack was assembled and laminated using the techniques described previously for the inner layer. Pins were placed in the punched registration holes to preserve alignment of inner layer features with layer 1 and 4 circuit traces. Again, it is probable that many constructions are possible, and those skilled in the art will be able to envision several possibilities.

The remaining process steps (drilling, plating, masking, etching) were conducted according to standard board shop protocol. The finished product was a four-layer board containing embedded resistors. Resistor properties are reviewed in Table 1 below.

EXAMPLE 7

Cured on Foil Lamination with an Additional Heat Bump

The resistor paste of Example 5 was treated as in example 6 however after the initial curing step of 170° C. for 1 hour the resistors were subjected to a heat bump of 290° C. for 2 minutes in a convection oven under a nitrogen atmosphere. Resistor properties are reviewed in Table 1 below.

EXAMPLE 8

Resistor Paste in Example 5 Embedded Using the Traditional Process

The resistor paste of Example 5 was screen printed on pre-patterned double sided core (½ oz Cu) using a 230 mesh screen. It is likely that many different types of double-sided core would work in this application, this is simply an example of one possibility that has been investigated. Regardless of the core chosen, it is preferable to print the resistors on copper traces that have been recently microetched to generate a fresh roughened copper surface which promotes good adhesion and intimate electrical contact between the printed resistor and the copper conductor pathway. After 5 min leveling time, the resistors were cured in a convection oven at 170° C. for 1 hr under a nitrogen atmosphere.

The cured inner layers were then laminated to prepare 4-layer boards. Prior to lamination the inner layers were subjected to a Bondfilm pretreatment to improve adhesion. The four-layer boards were constructed with the following materials:

One oz. copper foil, treated side down, 2 layers of 1080 prepreg, inner layer panel containing resistors (component side up), 2 layers of 1080, then another one oz. copper foil, treated side up. This stack was assembled and laminated using the techniques and lamination schedules described previously in Example 6. Pins were placed in the punched registration holes to preserve alignment of inner layer features with layer 1 and 4 circuit traces. Again, it is probable that many constructions are possible, and those skilled in the art will be able to envision several possibilities.

The remaining process steps (drilling, plating, masking, etching) were conducted according to standard board shop protocol. The finished product was a four-layer board containing embedded resistors. Resistor properties are reviewed in Table 1 below.

EXAMPLE 9

Resistor Paste Prepared from Polyimide of Example 2

A PTF resistor paste composition was prepared by using the polyimide solution in Example 2 and the additional components listed below.

The PTF resistor paste included one or more metal powders (or metal oxides), hydrophobic thermal crosslinkers, and an aromatic amine catalyst. The PTF resistor paste composition was prepared by mixing the following ingredients in an ambient environment with stirring to give a crude paste mixture.

| Ingredient | % by weight |
| --- | --- |
| Ruthenium dioxide powder | 22.4 |
| Bismuth ruthenate powder | 11.8 |
| Graphite | 1.5 |
| Alumina powder | 13.8 |
| Polyimide | 9.8 |
| RSS-1407 | 1.0 |
| Dimethylbenzylamine | 0.17 |
| butyl carbitol acetate | 39.53 |

The PTF resistor paste was 3-roll milled with a 1 mil gap with 3 passes each set at 0, 50, 100, 200, 250 and 300 psi pressure to yield a fineness of grind of 5/2.

EXAMPLE 10

Resistor Paste from Example 9 Embedded Using the Conventional Method

The resistor paste prepared in Example 9 was processed as outlined in Example 8 to yield 4-layer boards with embedded resistors prepared by the so-called conventional method. The resistor properties are reviewed in Table 1.

EXAMPLE 11

Resistor Paste from Example 9 Embedded Using the Cured-on-Foil Method

The resistor paste prepared in Example 9 was process as outlined in Example 6 to yield 4-layer boards with embedded resistors prepared by the cured-on-foil process. The resistor properties are reviewed in Table 1.

EXAMPLE 12

Resistor Paste Prepared with AryLite™ A100 as the Binder to Provide an Example of a Formulation that Works with the Cured-on-Foil Method But not the Conventional Method PTF resistors were prepared with AryLite™ A100, an aromatic polyester resin, as the binder. This resin has a Tg of 325° C. and a water uptake of 0.4%:

| Ingredient | Amount (g) |
| --- | --- |
| AryLite™ A100 | 10 |
| Ruthenium dioxide | 21.6 |
| Bismuth ruthenate | 15.7 |
| Silver powder | 5.0 |
| Alumina | 4.5 |
| Butyrolactone | 56 |

The paste was prepared by dissolving the resin in butyrolactone, followed by addition of the rest of the ingredients. After hand stirring, the crude paste was 3-roll milled with a 1 mil gap with 3 passes each set at 0, 50, 100, 200, 250 and 300 psi pressure to yield a fineness of grind of 4/2.

EXAMPLE 13

Resistor Paste from Example 12 Embedded Using the Conventional Method

The resistor paste prepared in Example 12 was processed as outlined in Example 8 to yield 4-layer boards with embedded resistors prepared by the so-called conventional method. The resistor properties are reviewed in Table 1.

EXAMPLE 14

Resistor Paste from Example 12 Embedded Using the Cured-on-Foil Method

The resistor paste prepared in Example 12 was process as outlined in Example 6 to yield 4-layer boards with embedded resistors prepared by the cured-on-foil process. The resistor properties are reviewed in Table 1.

EXAMPLE 15

Commercial Resistor Paste Embedded with Cured on Foil Method

Resistor paste TU-100-8 from Asahi Chemical was processed as in Example 6. Resistor properties are reviewed in Table 1 below.

TABLE 1

Resistor property comparison (40 mil × 1 square resistors)

| | | Example | | | | | | | |
| --- | --- | --- | --- | --- | --- | --- | --- | --- | --- |
| Property | Unit | 6 | 7 | 8 | 10 | 11 | 13 | 14 | 15 |
| Resistance (inner layer) | ohm | 136 | 131 | 126 | 141 | 120 | 106 | 98 | 42 |
| Full process resistance drift | % | 3.1 | 1.9 | −2.9 | −2.4 | 28.1 | 18.5 | −3.4 | −1.4 |
| 500 hr 85/85 resistance drift | % | 2.3 | 1.1 | 3.3 | 2.8 | 23.2 | 3.0 | 4.1 | 14.9 |
| 250 thermal cycle resistance drift | % | −0.73 | −0.14 | −3.4 | −3.8 | 16.7 | −2.2 | −2.9 | −0.86 |

Resistance drifts of less than 5% are desirable.

Example 15 illustrates that present-day commercial materials tend to exhibit poor 85/85 performance when printed directly on copper. This has been documented in the open art when commercial materials are embedded using the conventional process. Example 15 illustrates that undesirable resistance drift persists when commercial materials are printed directly on copper foil and embedded using the cured-on-copper method.

Examples 13 and 14 are made with an aromatic polyester as the binder. This resin has water uptake and glass transition values in the preferred range of the present invention, however the resistors prepared from this formulation are only suitably stable when the cured-on-foil method is employed to embed the resistors. When the conventional method is used, the resistors exhibit undesirable amounts of resistance drift during the printed circuit board manufacturing process.

Examples 10 and 11 are prepared with a polyimide that has water absorption and upper glass transition values in the preferred range for this invention. This formulation produces acceptable resistors when they are embedded using the conventional process, however excessive resistance drift occurs when these resistors are embedded using the cured-on-foil method.

Examples 6, 7, and 8 illustrate that the stability of resistors prepared from formulations that are the subject of this invention is acceptable regardless of the method used to embed the resistors in the circuit board.

What is claimed is:

1. A polymeric thick film ("PTF") resistor paste comprising:
   i. a polyimide component having a glass transition temperature greater than 250° C.,
   ii. a sterically hindered hydrophobic epoxy component; and
   iii. an organic solvent having a Hanson polar solubility parameter between 2.1 and 3.0 and having a normal boiling point between 210 and 260° C.,
   wherein the weight ratio of polyimide component ("A") to epoxy component ("B") is A:B, where A is between and including 1 to 15 and where B is 1, wherein the polyimide component and epoxy component are crosslinked together by means of a sterically hindered phenol crosslinking agent, and wherein the amount of sterically hindered phenol added to the polyimide component and the epoxy component is between 0.6 and 3.0 mole percent of the amount of sterically hindered epoxy component.

2. A PTF resistor paste in accordance with claim 1, wherein the sterically hindered phenol is a member of a group consisting of:
   3,3',5,5'-tetramethylbiphenol-4,4'-diol, 4,4'-isopropylidenebis(2,6-dimethylphenol), 4,4'-isopropylidenebis(2,6-dibromophenol) and combinations thereof.

3. A PTF resistor paste in accordance with claim 1, wherein the phenol is represented by the general formula,

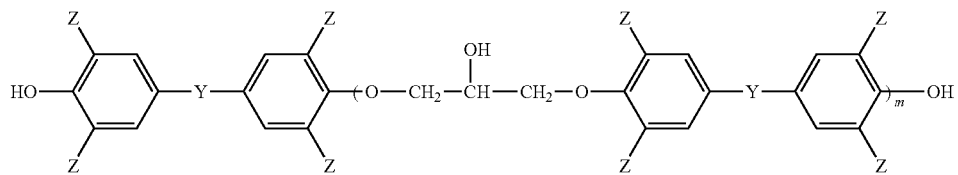
where Z is an alkyl, alkoxy, phenyl, phenoxy, halogen or combinations thereof,
where Y is a covalent bond, oxygen, sulfur, methylene, fluorenylidene, ethylidene, sulfonyl, cyclohexylidene, 1-phenylethylidene, $C(CH_3)_2$, or $C(CF_3)_2$, and
where m is an integer between and including 0, 1, 2, 3, 4 and 5.
* * * * *